US007120217B2

(12) United States Patent
Schwarzmueller

(10) Patent No.: US 7,120,217 B2
(45) Date of Patent: Oct. 10, 2006

(54) PHASE-LOCKED LOOP CIRCUIT

(75) Inventor: Marco Schwarzmueller, Heilbronn (DE)

(73) Assignee: ATMEL Germany GmbH, Heilbronn (DE)

( * ) Notice: Subject to any disclaimer, the term of this patent is extended or adjusted under 35 U.S.C. 154(b) by 665 days.

(21) Appl. No.: 09/971,748

(22) Filed: Oct. 4, 2001

(65) Prior Publication Data

US 2002/0041651 A1    Apr. 11, 2002

(30) Foreign Application Priority Data

Oct. 10, 2000    (DE) ............................... 100 50 294

(51) Int. Cl.
H04L 12/50    (2006.01)
H03L 7/00    (2006.01)
H03L 7/06    (2006.01)

(52) U.S. Cl. ................... 375/376; 375/374; 375/354; 327/141; 327/147; 327/146; 327/148; 327/155; 327/156

(58) Field of Classification Search ............... 327/156, 327/157; 331/17, 10, 1; 324/65; 375/156, 375/376
See application file for complete search history.

(56) References Cited

U.S. PATENT DOCUMENTS

| 4,027,238 | A | * | 5/1977 | Loch ........................... 324/695 |
| 4,819,081 | A | * | 4/1989 | Volk et al. ..................... 327/12 |
| 5,121,085 | A | | 6/1992 | Brown |
| 5,281,789 | A | * | 1/1994 | Merz et al. ............... 219/76.15 |
| 5,384,502 | A | * | 1/1995 | Volk ........................... 327/157 |
| 5,592,120 | A | * | 1/1997 | Palmer et al. ............... 327/536 |
| 5,654,675 | A | * | 8/1997 | Bruccoleri et al. ........... 331/17 |
| 5,740,213 | A | * | 4/1998 | Dreyer ........................ 375/374 |
| 5,821,789 | A | * | 10/1998 | Lee ............................. 327/156 |
| 5,838,204 | A | * | 11/1998 | Yao ............................. 331/1 R |
| 5,854,575 | A | * | 12/1998 | Fiedler et al. ................. 331/10 |

FOREIGN PATENT DOCUMENTS

| DE | 19617635 | 11/1997 |
| EP | 0582390 | 2/1994 |
| EP | 0642227 | 3/1995 |
| EP | 642227 A1 * | 3/1995 |
| EP | 0674392 | 9/1995 |
| EP | 0718978 | 6/1996 |
| GB | 1495203 | 12/1977 |

OTHER PUBLICATIONS

Underhill et al.; "Split-Loop Method for Wide-Range Frequency Synthesiser with Good Dynamic Performance"; Electronics Letters, Jun. 21, 1979, vol. 15, No. 13, pp. 391 to 393.
J Craninckx et al.: Fully Integrated CMOS DCS-1800 Frequency Synthesizer; IEEE Journal of Solid-State Circuits, IEEE Inc. New York, US; vol. 33, No. 12, Dec. 1998, pp. 2054-2065, XP000880509; ISSN: 0018-9200.

* cited by examiner

Primary Examiner—Kevin Kim
Assistant Examiner—Linda Wong
(74) Attorney, Agent, or Firm—W. F. Fasse; W. G. Fasse

(57) ABSTRACT

In a PLL circuit including a voltage-controlled oscillator, a phase detector and a final control element, the final control element contains two separate channels, between the phase detector and the voltage controlled oscillator, wherein one channel processes the useful signal components and the other channel processes the disturbance signal components of the synchronization pulses. Each channel has two tracks, for generation of a potential difference, wherein each track is connected to a capacitor plate.

24 Claims, 4 Drawing Sheets

PHASE-LOCKED LOOP CIRCUIT

FIELD OF THE INVENTION

The invention relates to a PLL circuit comprising a voltage controlled oscillator, a phase detector and a final control element.

BACKGROUND OF THE INVENTION

FIG. 1 shows a conventional phase-locked loop (PLL) circuit. The conventional PLL circuit comprises a phase detector (PD) 3, a charge pump (CP) 4, an external loop filter (LF) 5, a voltage-controlled oscillator (VCO) 1 and a frequency divider (DIV) 2. The phase detector 3 detects the phase difference between the reference frequency $f_{Ref}$ and the actual frequency $f_{irst}$ dependent on the VCO. If the phase of the actual frequency $f_{ist}$ leads the phase of the reference frequency $f_{Ref}$, a falling pulse DW, the duration of which corresponds to the phase difference between the reference frequency $f_{Ref}$ and the actual frequency $f_{irst}$, is generated and directed to a DW output 15 of the phase detector 3. If the phase of the actual frequency $f_{ist}$ lags the phase of the reference frequency $f_{Ref}$, a rising pulse UP, the duration of which corresponds to the phase difference between the reference frequency $f_{Ref}$ and the actual frequency $f_{ist}$, is generated and directed to a UP output 14 of the phase detector 3. If the actual frequency $f_{ist}$ synchronizes with the reference frequency $f_{Ref}$, a UP pulse as well as a DW pulse are directed simultaneously to the UP and DW outputs 14, 15 respectively.

Upon receipt of the UP pulse from the phase detector 3, the charge pump 4 charges the external loop filter 5. Upon receipt of the DW pulse from the phase detector 3, the charge pump 4 discharges the external loop filter 5. If the applied voltage $V_1$ of the loop filter 5 increases upon receipt of a high voltage from the charge pump 4, the frequency $f_{vco}$ in the VCO 1 also rises. If, on the other hand, the applied voltage $V_1$ in the external loop filter 5 decreases as a result of receipt of the lower voltage from the charge pump 4, the oscillation frequency $f_{vco}$ the VCO 1 drops. The loop filter 5 and the charge pump 4 form components of the final control element 36 for the VCO 1. The final control element 36 converts the measurement result from the chase detector into a voltage, with which the oscillation frequency of the VCO can be influenced.

If the actual frequency $f_{ist}$ dependent on the oscillation frequency $f_{vco}$ of the VCO 1 is lower than the reference frequency $f_{Ref}$ and the phase of the actual frequency lags the phase of the reference frequency $f_{Ref}$, UP pulses are generated in the phase detector 3, as a result of which the charge pump 4 increases the voltage $V_1$ at the external loop filer 5. As a result of the increase in the voltage $V_1$ the oscillation frequency $f_{vco}$ of the VCO 1 rises. The increase in the oscillation frequency $f_{vco}$ causes the increase in the actual frequency $f_{ist}$ at the phase detector 3 and thus the approximation to the reference frequency $f_{Ref}$.

If, however, the actual frequency $f_{ist}$ dependent on the oscillation frequency $f_{vco}$ of the VCO 1 is higher than the reference frequency $f_{Ref}$, i.e. if the phase of the actual frequency $f_{ist}$ leads the phase of the reference frequency $f_{Ref}$, a DW pulse DW is generated in the phase detector 3, as a result of which the charge pump 4 decreases the voltage $V_1$ at the external loop filter 5. As a result of the decrease in the voltage $V_1$ the oscillation frequency $f_{vco}$ the VCO 1 also decreases. The decrease in the oscillation frequency $f_{vco}$ causes the drop in the actual frequency $f_{ist}$ at the phase detector 3 and thus the approximation to the reference frequency $f_{Ref}$.

To smooth the current pulses of the charge pump 4, which are initiated because of the UP and DW pulses in the phase detector 3, a filter capacitor $C_G$ 8 is located between the charge pump 4 and the loop filter 5.

By virtue of the fact that the sensitivity and thus the transconductance $K_{vco}=f(V_1)$ of the VCO 1 is not constant over the whole voltage range, but can vary by a factor 4 over the whole voltage range, for example, an additional switch 17 is located between the input of the VCO 1 and the charge pump 4, which should at least partially compensate this effect.

The external loop filter 5 comprises a first capacitor $C_{S1}$ 9, with which the voltage $V_1$ for the VCO 1 is generated, and an array connected in series comprising a resistor $R_S$ 28 with a second capacitor $C_{S2}$ 10 connected in parallel.

The dimensioning of such a PLL circuit for applications in the field of telecommunications is configured such that circuit-related disturbances are as small as possible. Firstly, disturbances are caused by the currents $I_1$ and $I_2$. However, this disturbance influence decreases in relation to the useful signal $V_1$, the greater the current I from the charge pump 4. This, in turn, necessitates an increase in the capacitance of the capacitor $C_{S1}$ 9 in order to come to the identical voltage value $V_1$.

Secondly, a further disturbance is caused by the modulation of the output frequency with the thermal noise of the resistor $R_S$ 28 in the VCO 1. This disturbance increases, the greater the resistance $R_S$ 28 and the greater the transconductance $K_{vco}$ of the VCO. Typical values for a loop filter 5 in the field of telecommunications are I=0.1 mA-2 mA; $C_{S1}+C_{S2}$=200 pF-5 nF; $R_S$=100 Ω-2 kΩ.

However, a disadvantage here is that, because of the large capacitances required as a result of the reduction of disturbance influences, the loop filter 5 cannot be integrated into the PLL circuit because, for example, even in the case of a typically used capacitance of $C_{S1}$ of 1 nF, for example, a surface area of approximately 1 mm² is required. If the capacitances $C_{S1}$ and $C_{S2}$ were of smaller dimensions in the loop filter 5, then the current I would also have to be decreased and the resistance $R_S$ increased. As a result, the disturbances arising in the PLL circuit would be too great and therefore the requirements above all for the field of telecommunications could not be met.

SUMMARY OF THE INVENTION

The present invention seeks to provide a PLL circuit, in which the functions of a loop filter are also integrated in the PLL circuit without causing an increase in the disturbance effects.

According to the present invention, there is provided a PLL circuit comprising a voltage-controlled oscillator for generation of an oscillation frequency ($f_{vco}$), a phase detector for measurement of the phase deviation, wherein synchronization pulses, which can have useful signal and disturbance signal components, are generated dependent on the phase deviation, and a final control element containing at least one capacitor, which, dependent on the synchronization pulses, generates a voltage which serves as a correcting variable for the voltage-controlled oscillator, wherein the final control element contains at least two separate channels between the phase detector and the voltage-controlled oscillator, and wherein at least one channel processes the useful signal components and at least one other channel processes the disturbance signal components of the synchronization pulses.

These different signal components can be separated from one another and processed on the basis of their different duration of effect.

The advantages of the invention lie in the fact that the previous opposing demands on the dimensioning of the components are dispensed with as a result of the division into a separate useful signal channel and a separate disturbance signal channel.

Each component of the final control element is subject to only one channel and thus to only one requirement, and therefore it can be dimensioned in an optimum manner for the respective purpose.

A further advantageous development of the invention is that at least one channel in the final control element has at least two tracks, with which potential differences, and no longer absolute voltage as previously usual, are generated in the final control element. In this case, each track is connected to a capacitor plate which is charged or discharged by the current sources so that potential differences are set between two tracks of a feed line. Each current source is connected to a switch, with which the current source is connected to the track or disconnected, the switches being operated in dependence on the synchronisation pulses generated in the phase detector. Currents acting in opposite directions flow because of the generation of potential differences. These currents, in turn, generate opposed disturbances, which, although identical with respect to quantity, compensate one another. As a result of this disturbance compensation, the capacitance, and thus the surface area requirement of the capacitor or the capacitors, can be reduced to such an extent that they can be integrated into a PLL circuit. As a result of such a construction, with which potential differences are generated instead of absolute voltages, disturbances in supply voltage or supply current may be balanced. The transconductance of the VCO may also be split into two independent sub-ranges by feeding several control voltages into the VCO. One sub-range processes the useful signal. This area is insensitive to disturbance influences. The transconductance $K_{1vco}$ of this area has no influence on the properties of the circuit. The other sub-range processes the disturbances. The transconductance $K_{2vco}$ of this area has great influence on the properties of the circuit. An advantageous $K_{2vco}$ value can be selected here for this reason. This $K_{2vco}$ value and the resistance value $R_S$, which determines the signal/noise ratio, are adjusted to a desired value by advantageous scaling by changing the current of the current sources in spite of the small capacitances.

Another advantage of the invention is that the entire PLL circuit, with all the components thereof as disclosed herein, can be monolithically integrated, i.e. arranged in a monolithic configuration.

BRIEF DESCRIPTION OF THE DRAWINGS

Preferred embodiments of the present invention will now be described, by way of example only, with reference to the accompanying drawings, of which.

DESCRIPTION OF THE PREFERRED EMBODIMENTS

Figure 1:
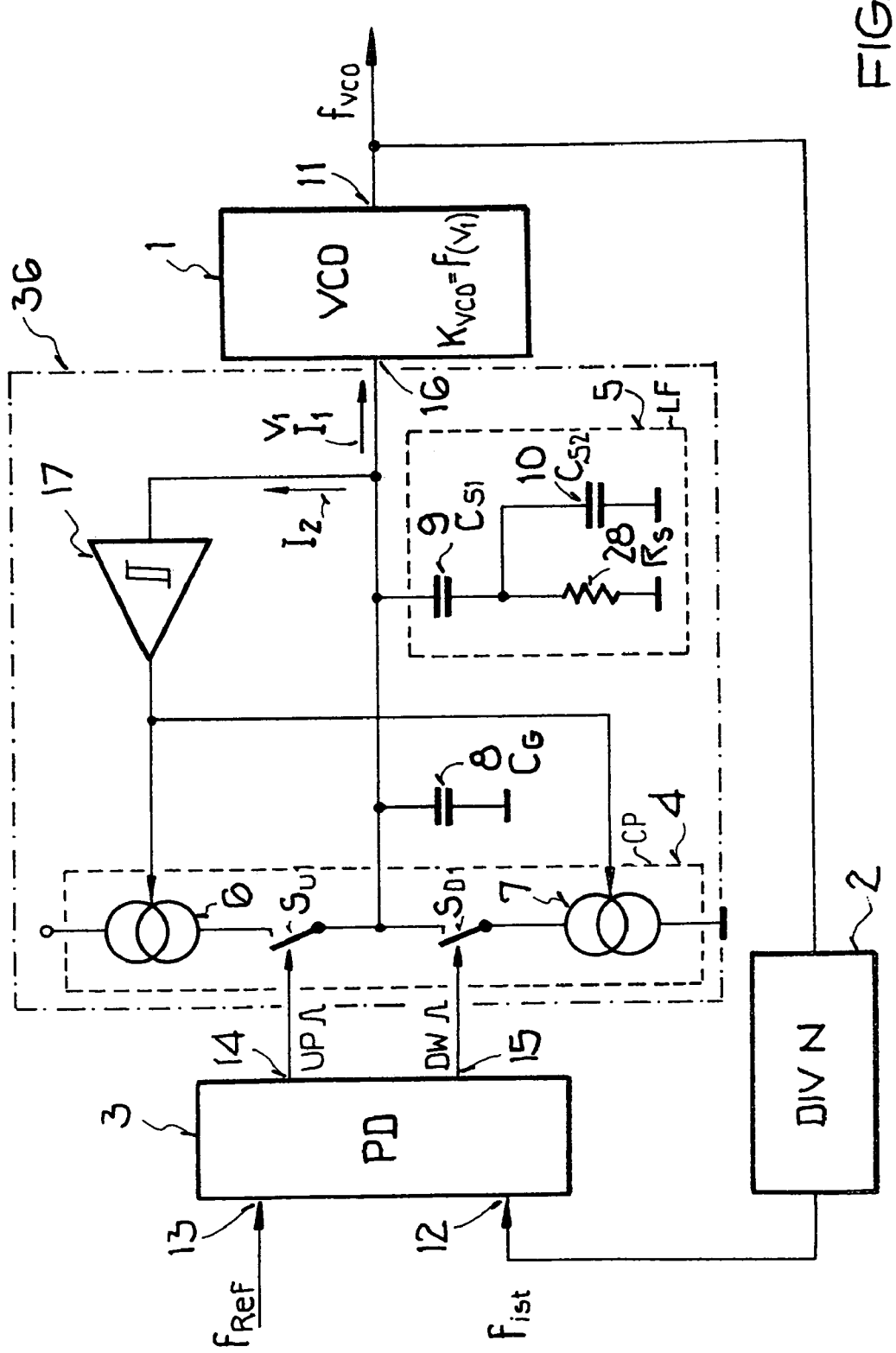
FIG. 1 shows a PLL circuit with external loop filter according to the prior art.
Figure 2A:
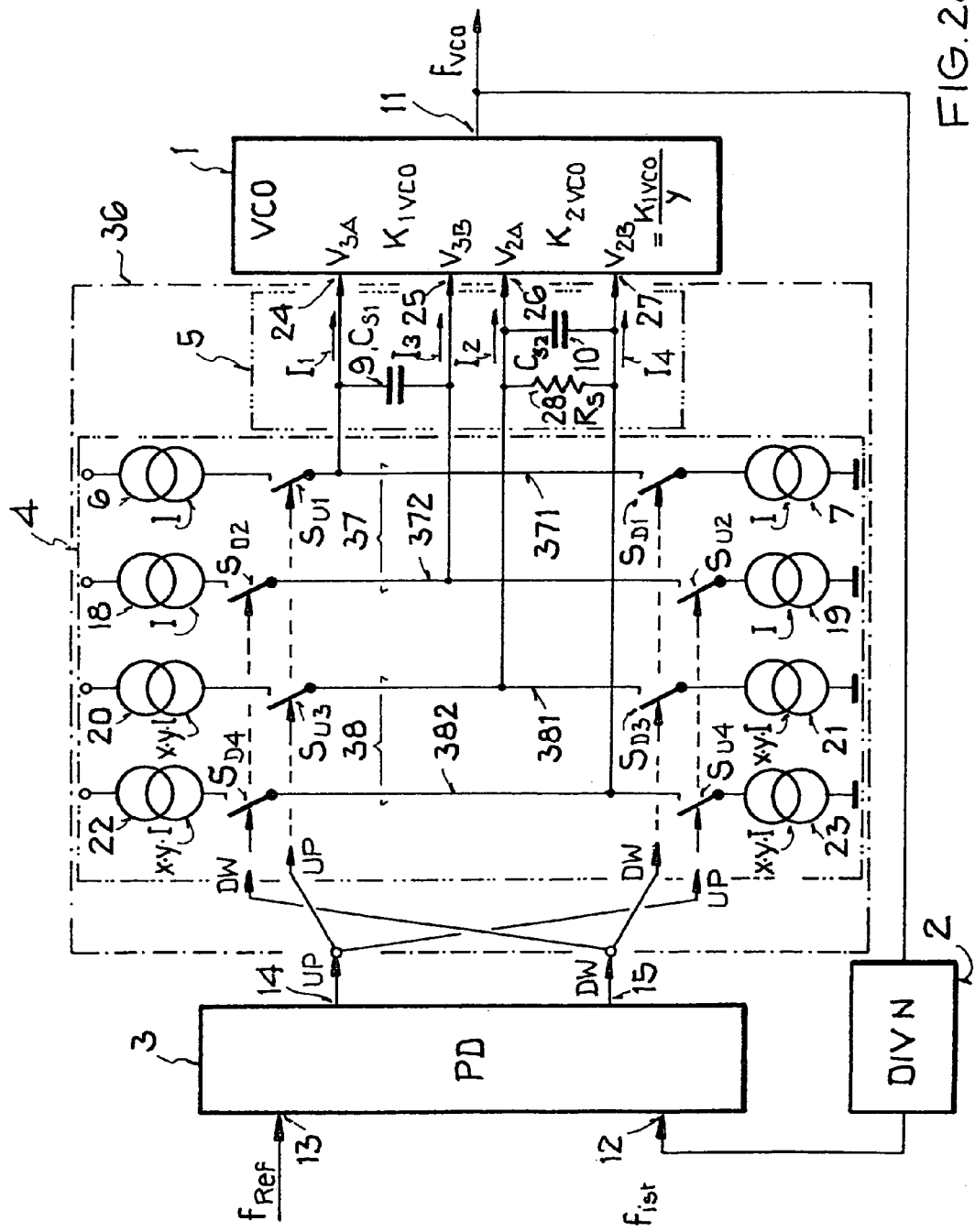
FIG. 2a shows a PLL circuit according to a first embodiment of the present invention with fully integrated final control element.

FIG. 2a shows a PLL circuit with fully integrated final control element. The VCO 1 makes available the oscillation frequency $f_{vco}$ of the PLL circuit at its output 11. The oscillation frequency $f_{vco}$ is divided by the factor N in a frequency divider 2 in a feedback path from the output 11 to a frequency detector 3. This results in an oscillation with an actual frequency, which lies in the region of the reference frequency $f_{Ref}$ and the phase difference of which can be determined by the phase detector 3. For this, the constant reference frequency $f_{Ref}$ is fed in at one input 13 of the phase detector 3 and the actual frequency $f_{ist}$ dependent on the VCO is fed in at the other input 12. The phase differences of the two oscillations are determined in the phase detector 3. In this case, the phase detector 3 can also be configured as a phase frequency detector, which not only compares the phase, but also the frequency of the two oscillations $f_{Ref}$ and $f_{ist}$. Depending on the result of this comparison, as already described in connection with FIG. 1, two output signals, a UP pulse and/or a DW pulse, are formed at the two outputs 14, 15. These pulses are used to control the final control element 36, which converts the measurement result, which is present in the form of pulses, into voltages with which the VCO 1 can be controlled. With each of these UP and DW pulses several (four in each case in this illustration) switches $S_{U1}$, $S_{U2}$, $S_{U3}$, $S_{U4}$ and $S_{D1}$, $S_{D2}$, $S_{D3}$, $S_{D4}$ are operated, and thereby the current sources 6, 7, 18, 19, 20, 21, 22 and 23 are connected or disconnected. This part of the arrangement forms the charge pump 4 of the final control element 36. In this example embodiment, two double-track channels 37, 38 are formed, wherein each track 371, 372 of one channel 37 and each track 381, 382 of the other channel 38 is connected respectively to a respective capacitor plate, as a result of which a potential difference is respectively built-up between the tracks 371 and 372 or 381 and 382 in a channel 37 or 38.

In the case of a UP pulse the current sources 6 and 19 generate a current I by operation of the switches $S_{U1}$ and $S_{U2}$, in the case of a DW pulse current sources 7 and 18 generate the same current flowing in the opposite direction through $C_{S1}$ by operation of the switches $S_{D1}$ and $S_{D2}$. In the case of a UP pulse the current sources 20 and 23 generate a current x·y·I by operation of the switches $S_{U3}$ and $S_{U4}$, in the case of a DW pulse current sources 21 and 22 generate the same current flowing in the opposite direction through $C_{S2}$ by operation of the switches $S_{D3}$ and $S_{D4}$. The current sources are connected to capacitors $C_{S1}$, $C_{S2}$, i.e. 9, 10 via the switches in such a manner that current source 6 charges one plate of the capacitor $C_{S1}$ via the UP pulse-dependent switch $S_{U1}$ and current source 7 charges this same plate of the capacitor $C_{S1}$ via a DW pulse-dependent switch $S_{D1}$. The other plate of $C_{S1}$, is connected, on the one hand, to current source 19 via switch $S_{U2}$ and, on the other hand, to current source 18 via switch $S_{D2}$. Each plate of $C_{S1}$ 9 is connected to a respective input 24, 25 of the VCO.

As a result of this arrangement of the current sources, a potential difference $V_{3A}-V_{3B}$ is generated in the $C_{S1}$ and forwarded to the VCO 1. The currents $I_1$ and $I_3$, which flow between the $C_{S1}$ and the VCO inputs, nonetheless still cause disturbances which are equally large in quantity and counterbalance one another because of their symmetric arrangement relative to one another, and therefore the potential difference $V_{3A}-V_{3B}$ of the $C_{S1}$ can be fed into the VCO free from disturbance. The plates of the second capacitor $C_{S2}$ 10 are likewise operated with four current sources. One plate of the $C_{S2}$ 10 is connected to current source 20 via the UP pulse-dependent switch $S_{U3}$ and to current source 21 via the DW pulse-dependent switch $S_{D3}$. The other plate of the $C_{S2}$ is supplied by current source 23 via switch $S_{U4}$ and by current source 22 via switch $S_{D4}$. A resistor $R_S$ 28 is arranged parallel to the $C_{S2}$ 10. The two capacitors 9, 10 and the resistor 28 form the loop filter 5 of the final control element 36. The $R_S$ 28 determines the signal/noise ratio of the array together with the transconductance $K_{2vco}$. Each plate of the $C_{S2}$ 10 is connected to a further input 26, 27 of the VCO 1. As a result of this arrangement of the current sources 20, 21, 22, 23, a potential difference $V_{2A}-V_{2B}$ is generated in the $C_{S2}$ and forwarded to the VCO. The currents $I_2$ and $I_4$, which flow between the $C_{S2}$ and the VCO inputs, nonetheless still cause disturbances which are equally large in quantity and counterbalance one another because of their symmetric arrangement relative to one another, and therefore the potential difference $V_{2A}-V_{2B}$ of the $C_{S2}$ can likewise be fed into the VCO free from disturbance. In the example of application, the VCO 1 is fed with two voltage values $V_{3A}-V_{3B}$, $V_{2A}-V_{2B}$ and from the sum of these voltage values and the base frequency $(K_{1vco}(V_{3A}-V_{3B}))+(K_{2vco}(V_{2A}-V_{2B}))+f_{vco0}$ generates an oscillation with the frequency $f_{vco}$ at its output 11. The two potential differences $V_{3A}-V_{3B}$, $V_{2A}-V_{2B}$ contribute to the adjustment of the oscillation frequency to a different degree. The potential difference $V_{3A}-V_{3B}$ generated in the first channel 37 of $C_{S1}$ is only dependent on the useful signal which results from the phase difference between the actual and the reference frequency. Dynamic disturbances have little influence on this potential difference. The potential difference $V_{2A}-V_{2B}$ generated in the second channel 38 of $C_{S2}$ only differs from zero in the case of a disturbance. The second channel 38 determines the dynamic properties of the arrangement. In the example of application, different transconductances $K_{1vco}$ and $K_{2vco}$ are used at the VCO 1. The transconductance $K_{1vco}$ is assigned to the potential difference $V_{3A}-V_{3B}$ dependent on the useful signal and the transconductance $K_{2vco}$ is assigned to the potential difference $V_{2A}-V_{2B}$ dependent on the disturbance signal. The two transconductances will generally differ greatly from one another $K_{1vco} \gg K_{2vco}$. However, they are sensitive to changes in the respective potential difference, and therefore $K_{1vco}=f(V_{3A}-V_{3B})$ and $K_{2vco}=f(V_{2A}-V_{2B})$ applies. However, since $V_{2A}-V_{2B} \approx 0$, $K_{2vco}$=constant, which in turn causes constant dynamic properties because the dynamic properties are only dependent on $K_{2vco}$. The factor between $K_{1vco}$ and $K_{2vco}$ is balanced by the dimensioning of the current sources 20, 21, 22 and 23 of the resistor 28 and the capacitor 10. In the example of application, the following interrelationship exists between the sensitivities $K_{1vco}$, $K_{2vco}$, the dimensioning of the resistor $R_S$ and the dimensioning of the current sources 20, 21, 22 and 23: $K_{2vco}=K_{1vco}/y$ and $R_S/x$=constant. Since the signal/noise ratio is proportional to $K_{2vco}$ and $\sqrt{R_S}$, a larger resistance value $R_S$ can be compensated by reducing the transconductance value $K_{2vco}$. If the potential differences amount to $(V_{3A}-V_{3B})=(V_{2A}-V_{2B})=0V$, then a base oscillation with a frequency of $f_{vco0} \neq 0$ Hz should be available at the output of the VCO 1.

This PLL circuit can operate with low noise with small capacitances of $C_{S1}$ and $C_{S2}$ and a resistor with a large resistance value $R_S$. As a result of the symmetric arrangement of the disturbance influences, caused by the generation of potential differences, these disturbance influences counterbalance one another, as a result of the favourable scaling x·y of the current sources 20, 21, 22 and 23 the noise can be suppressed by a low $K_{2vco}$ in spite of the high resistance. As a result of the feed of potential differences, this PLL circuit is also insensitive to fluctuations of supply systems. Because of the smaller components, in particular the capacitances of $C_{S1}$ and $C_{S2}$, such a PLL circuit can be fully housed in a single integrated circuit (IC), especially if the IC is manufactured using bipolar, CMOS, BICMOS or other IC technology. It is an advantage, particularly in the communications field, if ICs operate independently of fluctuations in supply voltages or supply currents, are small and operate free from disturbance. External loop filters are no longer necessary. The additional current sources and switches can be accommodated in a very small space.

Figure 2B:
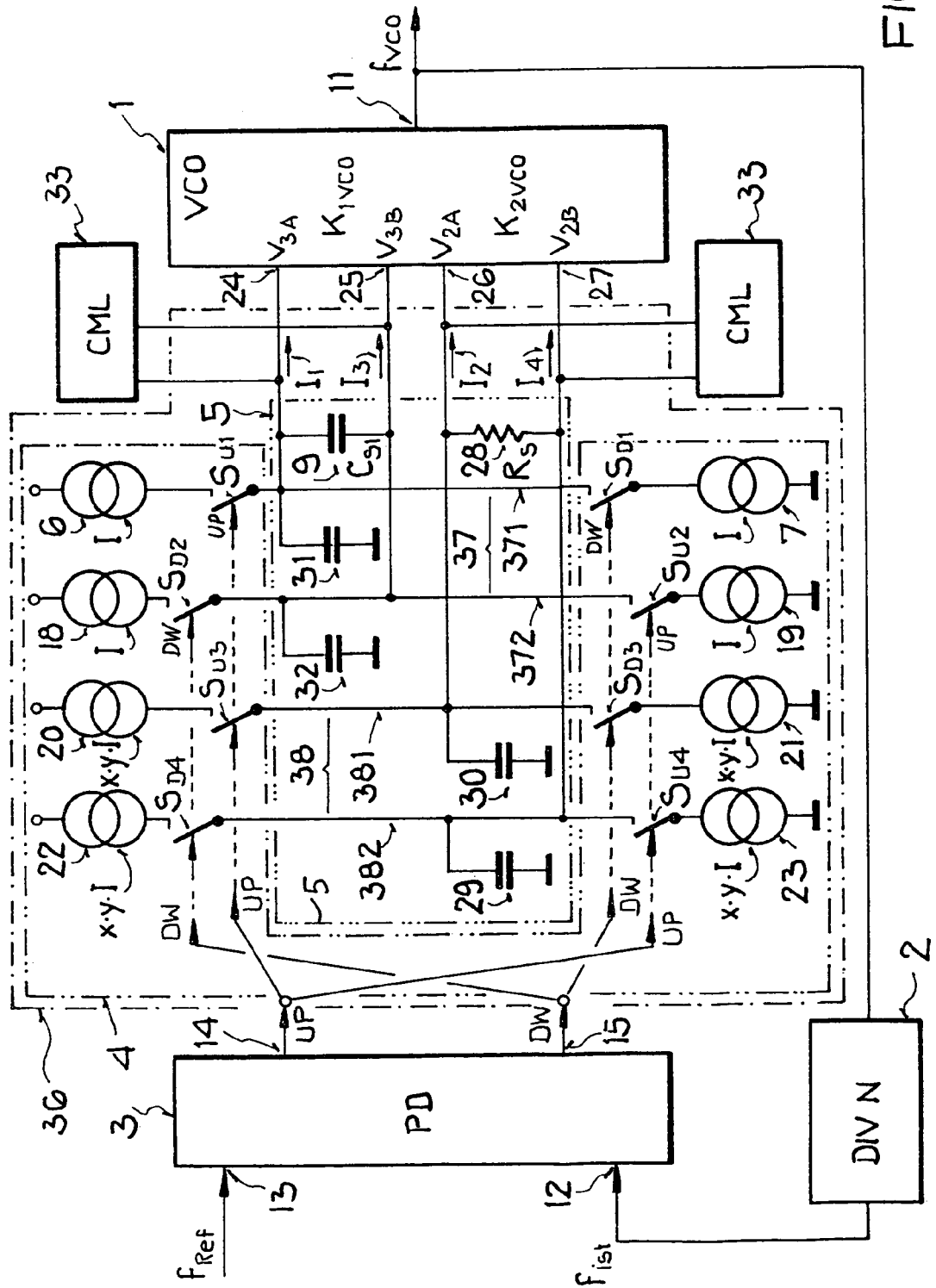
FIG. 2b shows a PLL circuit according to a second embodiment of the present invention with fully integrated final control element and a common mode loop.

FIG. 2b shows a PLL circuit with fully integrated final control element and a common mode loop. The VCO 1 makes available the oscillation frequency $f_{vco}$, where $f_{vco}$=960 MHz, of the PLL circuit at its output 11. The oscillation frequency $f_{vco}$ is divided in a frequency divider 2 by the factor N=64. This results in an oscillation with an actual frequency $f_{ist}$=15 MHz, which lies in the range of the reference frequency $f_{Ref}$, where $f_{Ref}$=14.2969 MHz, and the phase difference of which can be determined by the phase detector 3. For this, the constant reference frequency $f_{Ref}$, where $f_{Ref}$=14.2969 MHz, is fed in at one input 13 of the phase detector 3 and the actual frequency $f_{ist}$ dependent on the VCO, where $f_{ist}$=15 MHz, is fed in at the other input 12. The phase differences of the two oscillations are determined in the phase detector 3. In this case, the phase detector 3 can also be configured as a phase frequency detector, which compares not only the phase, but also the frequency of the two oscillations $f_{Ref}$ and $f_{ist}$. Depending on this comparison result, as already described in connection with FIG. 1, two output signals, a UP pulse and/or a DW pulse, having pulse durations depending on the magnitude of the phase difference, occur at the two outputs 14, 15. These pulses are used to control the final control element 36, which converts the measurement result, which is present in the form of pulses, into voltages with which the VCO 1 can be controlled. With each of these UP and DW pulses several (four in each case in this illustration) switches $S_{U1}$, $S_{U2}$, $S_{U3}$, $S_{U4}$ and $S_{D1}$, $S_{D2}$, $S_{D3}$, $S_{D4}$ are operated, and thereby the current sources 6, 7, 18, 19, 20, 21, 22 and 23 are connected or disconnected. This part of the arrangement forms the charge pump 4 of the final control element 36. In this example embodiment, two double-track channels 37, 38 are formed, wherein each track 371, 372 of one channel 37 and each track 381, 382 of the other channel 38 is connected respectively to a respective capacitor plate, as a result of which a potential difference is respectively built-up between the tracks 371 and 372 or 381 and 382 in a channel 37 or 38.

In the case of a UP pulse the current sources 6 and 19 generate a current I, where I=2.5 μA, by operation of the switches $S_{U1}$ and $S_{U2}$, in the case of a DW pulse current sources 7 and 18 generate the same current flowing in the opposite direction through $C_{S1}$, by operation of the switches $S_{D1}$ and $S_{D2}$. In the case of a UP pulse the current sources 20 and 23 generate a current x·y·I, where x·y·I=12.5 μA, by operation of the switches $S_{U3}$ and $S_{U4}$, in the case of a DW pulse current sources 21 and 22 generate the same current flowing in the opposite direction by operation of the switches $S_{D3}$ and $S_{D4}$. The current sources are connected to capacitors 9, 29, 30, 31, 32 via the switches in such a manner that current source 6 charges respective first plates of the capacitors 9 and 31 via the UP pulse-dependent switch $S_{u1}$, and current source 7 charges these same first plates of the capacitors 9 and 31 via a DW pulse-dependent switch $S_{D1}$. The capacitance of capacitor 9 $C_{S1}$ amounts to $C_{S1}=44$ pF in this example embodiment, while the capacitance of the other capacitor 31 amounts to only 10 pF. The other plate of the capacitor 31 is connected to earth, i.e. ground. The other plate of capacitor 9 $C_{S1}$, together with one plate of a fourth capacitor 32, is connected, on the one hand to the current source 19 via the switch $S_{U2}$ and, on the other hand, to the current source 18 via the switch $S_{D2}$. The other plate of the fourth capacitor 32 is connected to ground. One plate of the capacitor $C_{S1}$ 9 is connected to the input 24 of the VCO 1 together with one plate of the capacitor 31. The other plate of capacitor $C_{S1}$ 9 is connected to the input 25 of the VCO 1 together with one plate of the capacitor 32. The capacitance of the capacitor 32 amounts to 10 pF. A common mode loop (CML) 33 is arranged parallel to the capacitor 9 $C_{S1}$. The purpose of this CML is to set the working point of the first channel 37 at (V3A+V3B)/2. In addition, a second common mode loop (CML) 33 is arranged in the second channel 38 parallel to capacitors 29, 30 and to resistor $R_S$. This CML has the task of setting the working point (V2A+V2B)/2 of the second channel 38.

As a result of the arrangement of the current sources, a potential difference $V_{3A}-V_{3B}$ is forwarded to the VCO. The currents $I_1$ and $I_3$, which flow at the VCO inputs, nonetheless still cause disturbances which are equally large in quantity and counterbalance one another because of their symmetric arrangement relative to one another, and therefore the potential difference $V_{3A}-V_{3B}$ is fed into the VCO free from disturbance. One plate of the second capacitor 30 is connected to currant source 20 via the UP pulse-dependent switch $S_{U3}$ and to current source 21 via the DW pulse-dependent switch $S_{D3}$. The capacitance or capacitor 30 amounts to 10 pF. The other plate of the second capacitor is connected to earth. In the case of a fifth capacitor 29, one plate is supplied by current source 23 via the switch $S_{U4}$ and by current source 22 via the switch $S_{D4}$. The capacitance of the capacitor 29 amounts to 10 pF. The other plate of the capacitor 29 is connected to earth. A connection to a resistor $R_S$ 28 is located between one plate of the second capacitor 30 and one plate of the capacitor 29. The capacitors 9, 29, 30, 31, 32 and the resistor 28 form the loop filter 5 of the final control element 36. The value of the resistance 28 amounts to $R_S$=60 kΩ in this example of application. The $R_S$ value determines the signal/noise ratio of the arrangement. One plate of the second capacitor 30 is connected to the third input 26 of the VCO 1. One plate of the fifth capacitor 29 is connected to the fourth input 27 of the VCO 1. As a result of the arrangement of the current sources 20, 21, 22, 23, a potential difference $V_{2A}-V_{2B}$ is generated in the VCO 1 by the capacitors 30 and 29. The currents $I_2$ and $I_4$, which flow between the one plates of the capacitors 30 and 29 and the VCO inputs, nonetheless still cause disturbances which are equally large in quantity and counterbalance one another because of their symmetric arrangement relative to one another, and therefore the potential difference $V_{2A}-V_{2B}$ can likewise be fed into the VCO free from disturbance. In the example of application, the VCO 1 is supplied with two potential difference values $V_{3A}-V_{3B}$, $V_{2A}-V_{2B}$ and from the sum of these voltage values and the base frequency ($K_{1vco}(V_{3A}-V_{3B}))+(K_{2vco}(V_{2A}-V_{2B}))+f_{vco0}$ generates an oscillation with the frequency $f_{vco}$ at its output 11. The two potential differences $V_{3A}-V_{3B}$, $V_{2A}-V_{2B}$ contribute to the adjustment of the oscillation frequency to a different degree.

The potential difference $V_{3A}-V_{3B}$ generated in the first channel 37 of capacitor 9 $C_{S1}$ is only dependent on the useful signal which results from the phase difference between the actual and the reference frequency. Dynamic disturbances do not influence this potential difference. The potential difference $V_{2A}-V_{2B}$ generated in the second channel 38 of capacitors 29 and 30 only differs from zero in the case of a disturbance. The second channel 38 determines the dynamic properties of the arrangement. In this example embodiment, different transconductances (or frequency-voltage grain characteristics) $K_{1vco}$ and $K_{2vco}$ are used at the VCO 1. The transconductance $K_{1vco}=1000^{MHz}/v$ is assigned to the potential difference $V_{3A}-V_{3B}$ dependent on the useful signal and the transconductance $K_{2vco}=100^{MHz}/v$ is assigned to the potential difference $V_{2A}-V_{2B}$ dependent on the disturbance signal. The two transconductances will generally differ greatly from one another $K_{1vco}>>K_{2vco}$. The factor between $K_{1vco}$ and $K_{2vco}$ is balanced by the dimensioning of the current sources 20, 21, 22 and 23, the resistor 28 and the capacitor 10. In the present example embodiment, the following interrelationship exists between the sensitivities $K_{1vco}$, $K_{2vco}$, the dimensioning of the resistor $R_S$ and the dimensioning of the current sources 20, 21, 22 and 23: $K_{2vco}=K_{1vco}/y$, wherein in the present example embodiment y=10, and $R_S/x$=constant, wherein in the present example embodiment x=0.5. Since the signal/noise ratio is proportional to $K_{2vco}$ and $\sqrt{R_S}$, a larger resistance value $R_S$ can be compensated by reducing the transconductance value $K_{2vco}$. If the sum of the potential differences amounts to $(V_{3A}-V_{3B})=(V_{2A}-V_{2B})=0V$, then a base oscillation with a frequency of $f_{vco0}$=915 Hz should be available at the output of the VCO 1. This circuit can operate with low noise with small capacitances of capacitors 9, 29, 30, 31, 32 and a resistor with a large resistance value $R_S$.

As a result of the symmetric arrangement of the disturbance influences caused by the generation of potential differences, these disturbance influences counterbalance one another. As a result of the favourable scaling x·y of the current sources 20, 21, 22 and 23, the noise can be suppressed in spite of the high resistance on the basis of the low transconductance value $K_{2vco}$. As a result of the feed of potential differences, this PLL circuit is also insensitive to fluctuations of supply systems. Because of the smaller components, in particular the capacitances, such a PLL circuit can be fully housed in a single integrated circuit (IC), especially if the IC is manufactured using bipolar, CMOS, BICMOS or other IC technology. It is an advantage, particularly in the communications field, if ICs operate independently of fluctuations in supply voltages or supply currents, are small and operate free from disturbance. External loop filters are no longer necessary. The additional current sources and switches can be accommodated in a very small space.

Figure 3:
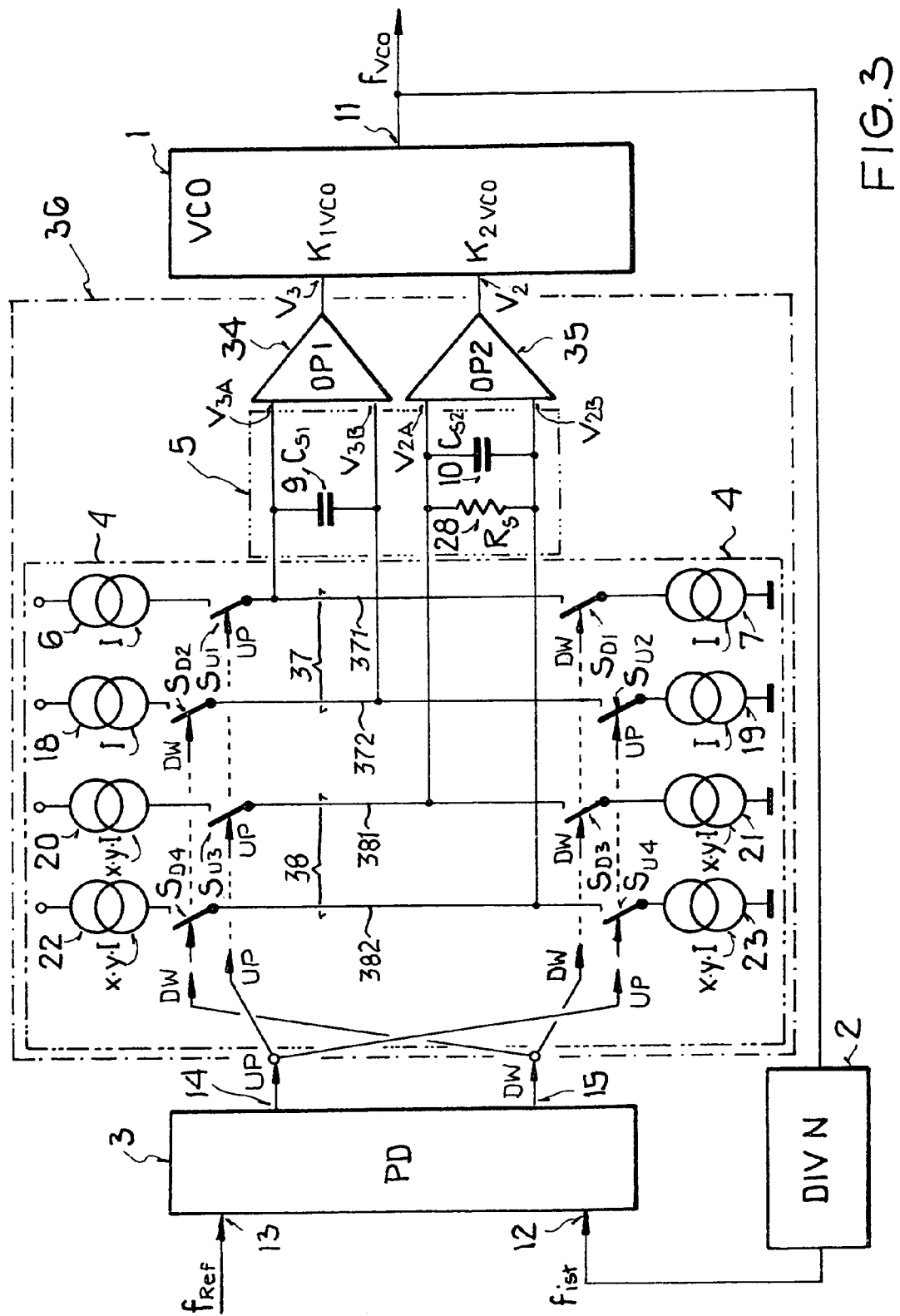
FIG. 3 shows an alternative PLL circuit according to a third embodiment of the present invention with fully integrated final control element.

FIG. 3 shows an alternative PLL circuit with operational amplifiers and the integrated functions of the loop filter. The VCO 1 makes available the oscillation frequency $f_{vco}$ of the PLL circuit at its output 11. The oscillation frequency $f_{vco}$ is divided in a frequency divider 2 by the factor N. This results in an oscillation with an actual frequency, which lies in the range of the reference frequency $f_{Ref}$ and the phase difference of which can be determined by the phase detector. For this, the constant reference frequency $f_{Ref}$ is fed in at one input 13 of the phase detector 3 and the actual frequency $f_{ist}$ dependent on the VCO is fed in to the other input 12. The phase differences of the two oscillations are determined in the phase detector 3. In this case, the phase detector 3 can also be configured as a phase frequency detector, which compares not only the phase, but also the frequency of the two oscillations $f_{Ref}$ and $f_{ist}$. Depending on this comparison result, as already described in connection with FIG. 1, two output signals, a UP pulse and/or a DW pulse, are formed at the two outputs 14, 15. These pulses are used to control the final control element 36, which converts the measurement result which is present in the form of pulses, into voltages with which the VCO 1 can be controlled. With each of these UP and DW pulses several (four in each case in this illustration) switches $S_{U1}$, $S_{U2}$, $S_{U3}$, $S_{U4}$ and $S_{D1}$, $S_{D2}$, $S_{D3}$, $S_{D4}$ are operated, and thereby the current sources 6, 7, 18, 19, 20, 21, 22 and 23 are connected or disconnected. This part of the arrangement forms the charge pump 4 of the final control element 36. In the example embodiment, two double-track channels 37, 38 are formed, wherein each track 371, 372 of one channel 37 and each track 381, 382 of the other channel 38 is connected respectively to a respective capacitor plate, as a result of which a potential difference is respectively built-up between the tracks 371 and 372 or 381 and 382 in a channel 37 or 38.

In the case of a UP pulse the current sources 6 and 19 generate a current I by operation of the switches $S_{U1}$ and $S_{U2}$, in the case of a DW pulse current sources 7 and 18 generate the same current acting in the opposite direction by operation of the switches $S_{D1}$ and $S_{D2}$. In the case of a UP pulse the current sources 20 and 23 generate a current x·y·I by operation of the switches $S_{U3}$ and $S_{U4}$, in the case of a DW pulse current sources 21 and 22 generate the same current acting in the opposite direction by operation of the switches $S_{D3}$ and $S_{D4}$. The current sources are connected to capacitors 9, 10 via the switches in such a manner that current source 6 charges one plate of the capacitor $C_{S1}$, via the UP pulse-dependent switch $S_{U1}$ and current source 7 charges this same plate of the capacitor $C_{S1}$ via a DW pulse-dependent switch $S_{D1}$. The other plate of $C_{S1}$ is connected, on the one hand, to current source 19 via switch $S_{U2}$ and, on the other hand, to current source 18 via switch $S_{D2}$. Each plate of $C_{S1}$ is connected to a respective input of a first operational amplifier OP1 34. The potential difference $V_{3A}-V_{3B}$ is determined in the OP1 and the result $V_3$ is connected to a first input of the VCO. The currents, which flow between the $C_{S1}$ and the OP1, nonetheless still cause disturbances which are equally large in quantity and counterbalance one another because of their symmetric arrangement relative to one another, and therefore the potential difference $V_{3A}-V_{3B}$ of the $C_{S1}$ can be fed into the OP1 free from disturbance. The plates of the second capacitor $C_{S2}$ 10 are likewise operated with four current sources. One plate of the $C_{S2}$ 10 is connected to current source 20 via the UP pulse-dependent switch $S_{U3}$ and to current source 21 via the DW pulse-dependent switch $S_{D3}$. The other plate of the $C_{S2}$ is supplied by current source 23 via switch $S_{U4}$ and by current source 22 via switch $S_{D4}$. A resistor $R_S$ 28 is arranged parallel to the $C_{S2}$ 10. The two capacitors 9, 10 and the resistor 28 form the $R_S$ loop filter 5 of the final control element 36. The $R_S$ 28 and the transconductance $K_{2vco}$ determine the signal/noise ratio of the arrangement. Each plate of the $C_{S2}$ 10 is connected to a respective input 26, 27 of a second operational amplifier OP2 35. As a result of this arrangement of the current sources 20, 21, 22, 23, a potential difference $V_{2A}-V_{2B}$ is applied in the OP2 and the result is forwarded from the output of OP2 to the VCO. The currents, which flow between the $C_{S2}$ and the OP2 inputs, nonetheless still cause disturbances which are equally large in quantity and counterbalance one another because of their symmetric arrangement relative to one another, and therefore the result $V_2$ can likewise be fed into the VCO 1 free from disturbance. In this example embodiment, the VCO 1 is fed with two voltage values $V_3$, $V_2$ and from the sum of these voltage values and the base frequency generates an oscillation with the frequency $f_{vco}$ at its output 11. The two supplied voltages $V_3$, $V_2$ contribute to the adjustment of the oscillation frequency to a different degree. The potential difference $V_{3A}-V_{3B}$ generated in the first channel 37 of $C_{S1}$ is only dependent on the useful signal which results from the phase difference between the actual and the reference frequency. Dynamic disturbances do not influence this potential difference. The potential difference $V_{2A}-V_{2B}$ generated in the second channel 38 of $C_{S2}$ only differs from zero in the case of a disturbance. The second channel 38 determines the dynamic properties of the arrangement. In this example embodiment, different transconductances $K_{1vco}$ and $K_{2vco}$ are used at the VCO 1. The transconductance $K_{1vco}$ is assigned to the potential difference $V_{3A}-V_{3B}$ dependent on the useful signal and the transconductance $K_{2vco}$ is assigned to the potential difference $V_{2A}-V_{2B}$ dependent on the disturbance signal. The two transconductances will generally differ greatly from one another $K_{1vco} \gg K_{2vco}$. However, they are sensitive to changes in the respective potential difference, and therefore $K_{1vco}=f(V_{3A}-V_{3B})$ and $K_{2vco}=f(V_{2A}-V_{2B})$ applies. However, since in the adjusted state $V_{2A}-V_{2B} \approx 0$, $K_{2vco}$=constant, which in turn causes the constant dynamic properties because the dynamic properties are only dependent on $K_{2vco}$. The factor between $K_{1vco}$ and $K_{2vco}$ is balanced by the dimensioning of the current sources 20, 21, 22 and 23, the resistor 28 and the capacitor 10. In this example embodiment, the following interrelationship exists between the sensitivities $K_{1vco}$, $K_{2vco}$, the dimensioning of the resistor $R_S$ and the dimensioning of the current sources 20, 21, 22 and 23: $K_{2vco}=K_{1vco}/y$ and $R_S/x$=constant. Since the signal/noise ratio is proportional to $K_{2vco}$ and $\sqrt{R_S}$, a larger resistance value $R_S$ can be compensated by reducing the transconductance value $K_{2vco}$. If the sum of the potential differences amounts to $(V_{3A}-V_{3B})=(V_{2A}-V_{2B})=0V$, then a base oscillation with a frequency of $f_{vco0} \neq 0$ Hz should be available at the output of the VCO 1. This PLL circuit can operate with low noise with small capacitances of $C_{S1}$ and $C_{S2}$ and a resistor with a large resistance value $R_S$. As a result of the symmetric arrangement of the disturbance influences, caused by the generation of potential differences, these disturbance influences counterbalance one another, as a result of the favorable scaling x·y of the current sources 20, 21, 22 and 23 the noise can be suppressed in spite of the high resistance by a low $K_{2vco}$. As a result of the feed of potential differences, this PLL circuit is also insensitive to fluctuations of supply systems. Because of the smaller components, in particular the capacitances of $C_{S1}$ and $C_{S2}$, such a PLL circuit can be fully housed in a single integrated circuit (IC), especially if the IC is manufactured using bipolar or BICMOS technology. It is an advantage, particularly in the communications field, if ICs operate independently of fluctuations in supply voltages or supply currents, are small and operate free from disturbance. External loop filters are no longer necessary. The additional current sources, operational amplifiers and switches can be accommodated in a very small space.

It will be understood that the above description of the present invention is susceptible to various modifications, changes and adaptations.

What is claimed is:

1. A phase-locked loop circuit comprising:
a voltage-controlled oscillator that has plural voltage inputs including at least one first voltage input and at least one second voltage input, and an oscillation output;
a phase detector that has an actual frequency input and plural control outputs including first and second control outputs, and that is adapted to detect a phase deviation of an actual frequency received at said actual frequency input relative to a reference frequency, and to produce first synchronization pulses having useful signal components and disturbance signal components at said first control output when said phase deviation is a lagging phase deviation, and to produce second synchronization pulses having useful signal components and disturbance signal components at said second control output when said phase deviation is a leading phase deviation;
a feedback path connecting said oscillation output of said voltage-controlled oscillator to said actual frequency input of said phase detector; and
a control arrangement interposed and connected between said control outputs of said phase detector and said voltage inputs of said voltage-controlled oscillator;
wherein:
said control arrangement includes a first channel and a second channel that connect said control outputs to said voltage inputs,
said first channel includes respective control inputs respectively connected to said first control output and said second control output, a first charge pump arrangement, and a first loop filter arrangement including at least one first capacitor dimensioned and connected so as to produce a first control voltage signal dependent only on said useful signal components of respective ones of said first and second synchronization pulses,
said first channel is connected to said at least one first voltage input of said voltage-controlled oscillator so as to provide said first control voltage signal to said at least one first voltage input,
said second channel includes respective control inputs respectively connected to said first control output and said second control output, a second charge pump arrangement, and a second loop filter arrangement differing from said first loop filter arrangement and including at least one passive filter element dimensioned and connected so as to produce a second control voltage signal dependent only on said disturbance signal components of respective ones of said first and second synchronization pulses, and
said second channel is connected to said at least one second voltage input of said voltage-controlled oscillator so as to provide said second control voltage signal to said at least one second voltage input.

2. The phase-locked loop circuit according to claim 1, wherein said at least one passive filter element of said second loop filter arrangement comprises a resistor.

3. The phase-locked loop circuit according to claim 2, wherein said resistor is arranged so that said second control voltage signal is tapped across said resistor.

4. The phase-locked loop circuit according to claim 2, wherein said at least one passive filter element of said second loop filter arrangement further comprises a second capacitor.

5. The phase-locked loop circuit according to claim 4, wherein said second capacitor is connected parallel to said resistor.

6. The phase-locked loop circuit according to claim 4, wherein said second capacitor is connected between one side of said resistor and a ground.

7. The phase-locked loop circuit according to claim 1, wherein said at least one passive filter element of said second loop filter arrangement comprises a second capacitor.

8. The phase-locked loop circuit according to claim 7, wherein said second capacitor is arranged so that said second control voltage signal is tapped across said second capacitor.

9. The phase-locked loop circuit according to claim 7, wherein said at least one passive filter element of said second loop filter arrangement further comprises a third capacitor, and wherein one side of each of said second and third capacitors is respectively connected to a ground.

10. The phase-locked loop circuit according to claim 1, further comprising:
a first common mode loop connected to said first channel between said first loop filter arrangement and said at least one first voltage input of said voltage-controlled oscillator, and
a second common mode loop connected to said second channel between said second loop filter arrangement and said at least one second voltage input of said voltage-controlled oscillator.

11. The phase-locked loop circuit according to claim 1, wherein:
said first channel includes two first channel tracks connected to said first charge pump arrangement and connected to each other via said first loop filter arrangement so as to produce said first control voltage signal based on a first voltage difference between said two first channel tracks, and
said second channel includes two second channel tracks connected to said second charge pump arrangement and connected to each other via said second loop filter arrangement so as to produce said second control voltage signal based on a second voltage difference between said two second channel tracks.

12. The phase-locked loop circuit according to claim 11, wherein:
said first capacitor is connected between said two first channel tracks, and
said passive filter element is connected between said two second channel tracks.

13. The phase-locked loop circuit according to claim 11, wherein:
said at least one first voltage input comprises a pair of first differential voltage inputs,
said two first channel tracks are respectively individually connected to said first differential voltage inputs,
said at least one second voltage input comprises a pair of second differential voltage inputs, and
said two second channel tracks are respectively individually connected to said second differential voltage inputs.

14. The phase-locked loop circuit according to claim 11, wherein:
said at least one first voltage input is a single first voltage input,
said first channel further includes a first operational amplifier having two first amplifier inputs respectively connected to said two first channel tracks and a first amplifier output connected to said first voltage input of said voltage-controlled oscillator, said at least one second voltage input is a single second voltage input, and said second channel further includes a second operational amplifier having two second amplifier inputs respectively connected to said two second channel tracks and a second amplifier output connected to said second voltage input of said voltage-controlled oscillator.

15. The phase-locked loop circuit according to claim 11, wherein:

said first charge pump arrangement includes two pairs of first current sources and two pairs of first switches, one pair of said first switches is controlled respectively individually by said first and second control outputs of said phase detector and controlledly connects one pair of said first current sources to one of said first channel tracks, another pair of said first switches is controlled respectively individually by said first and second control outputs of said phase detector and controlledly connects another pair of said first current sources to another of said first channel tracks, said second charge pump arrangement includes two pairs of second current sources and two pairs of second switches, one pair of said second switches is controlled respectively individually by said first and second control outputs of said phase detector and controlledly connects one pair of said second current sources to one of said second channel tracks, and another pair of said second switches is controlled respectively individually by said first and second control outputs of said phase detector and controlledly connects another pair of said second current sources to another of said second channel tracks.

16. A phase-locked loop circuit comprising:

a voltage-controlled oscillator that has plural voltage inputs including at least one first voltage input and at least one second voltage input, and an oscillation output;

a phase detector that has an actual frequency input and plural control outputs including first and second control outputs, and that is adapted to detect a phase deviation of an actual frequency received at said actual frequency input relative to a reference frequency, and to produce first synchronization pulses having useful signal components and disturbance signal components at said first control output when said phase deviation is a lagging phase deviation, and to produce second synchronization pulses having useful signal components and disturbance signal components at said second control output when said phase deviation is a leading phase deviation;

a feedback path connecting said oscillation output of said voltage-controlled oscillator to said actual frequency input of said phase detector; and a control arrangement interposed and connected between said control outputs of said phase detector and said voltage inputs of said voltage-controlled oscillator; wherein:

said control arrangement includes a first channel and a second channel;

said first channel includes a first charge pump arrangement, first channel control inputs respectively connected to said first control output and said second control output of said phase detector, and a first loop filter arrangement including at least one first capacitor connected between said first charge pump arrangement and said at least one first voltage input of said voltage-controlled oscillator;

said second channel includes a second charge pump arrangement, second channel control inputs respectively connected to said first control output and said second control output of said phase detector, and a second loop filter arrangement including at least one passive filter element connected between said second charge pump arrangement and said at least one second voltage input of said voltage-controlled oscillator;

said first channel has first parameters including a first pump current that characterizes said first charge pump arrangement, a first filter characteristic that characterizes said first loop filter arrangement, and a first frequency-voltage gain characteristic that characterizes said at least one first voltage input of said voltage-controlled oscillator;

said second channel has second parameters including a second pump current that characterizes said second charge pump arrangement, a second filter characteristic that characterizes said second loop filter arrangement, and a second frequency-voltage gain characteristic that characterizes said at least one second voltage input of said voltage-controlled oscillator; and at least one of said second parameters differs from a counterpart one of said first parameters so that a first control voltage signal provided to said at least one first voltage input of said voltage-controlled oscillator from said first channel is dependent predominantly on said useful signal components of said first and second synchronization pulses, and a second control voltage signal provided to said at least one second voltage input of said voltage-controlled oscillator from said second channel is dependent predominantly on said disturbance signal components of said first and second synchronization pulses.

17. The phase-locked loop circuit according to claim 16, wherein at least a selected one of said channels has at least two tracks for generation of a potential difference between said two tracks as said control voltage signal of said selected channel, and wherein said selected channel includes a capacitor being said first capacitor or said passive filter element, and each one of said tracks is connected to a respective capacitor plate of said capacitor.

18. The phase-locked loop circuit according to claim 17, wherein said charge pumps include current sources, and each one of said tracks of one of said channels is connected with two of said current sources that are effective to drive respective currents in opposite directions relative to one another.

19. The phase-locked loop circuit according to claim 18, wherein said current sources include different current sources respectively having different current magnitudes as said pump currents thereof.

20. The phase-locked loop circuit according to claim 18, wherein said control arrangement further comprises switches connected to said current sources, whereby said switches selectively connect or disconnect said current sources with respect to respective ones of said tracks, and said switches are connected to respective ones of said control outputs of said phase detector to be controlled by said synchronization pulses.

21. The phase-locked loop circuit according to claim 16, wherein said voltage-controlled oscillator has respective different ones of said frequency-voltage gain characteristics respectively at said voltage inputs thereof.

22. The phase-locked loop circuit according to claim 16, wherein said first channel and said second channel respectively further comprise operational amplifiers respectively interposed between said loop filter arrangements and said voltage inputs.

23. An integrated circuit incorporating a phase-locked loop circuit according to claim 16 integrated therein.

24. The integrated circuit according to claim 23, wherein said integrated circuit is monolithically integrated.

* * * * *

UNITED STATES PATENT AND TRADEMARK OFFICE
CERTIFICATE OF CORRECTION

PATENT NO. : 7,120,217 B2
APPLICATION NO. : 09/971748
DATED : October 10, 2006
INVENTOR(S) : Schwarzmueller It is certified that error appears in the above-identified patent and that said Letters Patent is hereby corrected as shown below:

Column 1,
Line 17, after "frequency", replace "$f_{irst}$" by --$f_{ist}$--;
Line 21, after "frequency" (second occurrence), replace "$f_{irst}$" by --$f_{ist}$--;
Line 44, after "the" (second occurrence), replace "chase" by --phase--;

Column 7.
Line 2, after "switch", replace "$S_{u1}$" by --$S_{U1}$--;
Line 34, after "to", replace "currant" by --current--;

Column 8,
Line 10, after "voltage", replace "grain" by --gain--.

Signed and Sealed this

Tenth Day of April, 2007

JON W. DUDAS
*Director of the United States Patent and Trademark Office*